US010229938B2

(12) United States Patent
Zhang et al.

(10) Patent No.: US 10,229,938 B2
(45) Date of Patent: Mar. 12, 2019

(54) ARRAY SUBSTRATE AND FABRICATION METHOD THEREOF

(71) Applicants: BOE TECHNOLOGY GROUP CO., LTD., Beijing (CN); BEIJING BOE DISPLAY TECHNOLOGY CO., LTD., Beijing (CN)

(72) Inventors: Ming Zhang, Beijing (CN); Chao Fan, Beijing (CN); Liquan Cui, Beijing (CN); Zhaohui Hao, Beijing (CN); Woong Sun Yoon, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 51 days.

(21) Appl. No.: 14/429,886

(22) PCT Filed: Jul. 18, 2014

(86) PCT No.: PCT/CN2014/082558
§ 371 (c)(1),
(2) Date: Mar. 20, 2015

(87) PCT Pub. No.: WO2015/039492
PCT Pub. Date: Mar. 26, 2015

(65) Prior Publication Data
US 2016/0035747 A1 Feb. 4, 2016

(30) Foreign Application Priority Data

Sep. 17, 2013 (CN) .......................... 2013 1 0425475

(51) Int. Cl.
H01L 23/50 (2006.01)
H01L 27/12 (2006.01)
G02F 1/1345 (2006.01)

(52) U.S. Cl.
CPC .......... *H01L 27/124* (2013.01); *G02F 1/1345* (2013.01); *H01L 27/1248* (2013.01); *H01L 27/1259* (2013.01)

(58) Field of Classification Search
CPC ............... H01L 27/1259; H01L 27/124; H01L 21/4763; H01L 23/50
See application file for complete search history.

(56) References Cited

U.S. PATENT DOCUMENTS 8,310,066 B2 * 11/2012 Sasaki .................... H01L 22/34
257/777
2007/0052895 A1 3/2007 Chen
(Continued)

FOREIGN PATENT DOCUMENTS

CN 101217155 A 7/2008
CN 102314003 A 1/2012
(Continued)

OTHER PUBLICATIONS

Third Chinese Office Action Appln. No. 201310425475.0; dated Mar. 15, 2016.
(Continued)

*Primary Examiner* — Daniel Whalen
*Assistant Examiner* — Suberr Chi
(74) *Attorney, Agent, or Firm* — Ladas & Parry LLP

(57) ABSTRACT

An array substrate and a fabrication method thereof are provided. The array substrate comprises a plurality of wiring regions (S-S') disposed in a non-display region, a plurality of signal lines (111, 112) is provided in the wiring regions (S-S'), at least part of the signal lines (111, 112) within each of the wiring regions (S-S') are respectively formed by connecting conducting wires (121, 123) located in different layers in series; and any two of the signal lines (111, 112) within a same wiring region (S-S') have a resistance differ-
(Continued)

ence within a threshold range. The same signal line (111, 112) is disposed in different layers, so that the signal line (111, 112) is bent in a plane perpendicular to the array substrate, which achieves of the extension of a length of the signal line (111, 112), and thus increases the length and resistance of the signal line (111, 112), the resistance of which needs to be increased. At the same time, the width taken by the signal line (111, 112) is not increased, so that the signal line (111, 112) has a greater density in the wiring region (S-S'), which achieves the reduction in the number of drivers and the fabrication costs, and meanwhile avoids a problem that it is not conducive to realize a narrow frame due to a large area of the non-display region, resulted from a large area taken by a single signal line (111, 112).

2 Claims, 4 Drawing Sheets

(56) References Cited

U.S. PATENT DOCUMENTS

2008/0157364 A1   7/2008  Yang et al.
2012/0313905 A1   12/2012 Kang et al.
2014/0159204 A1   6/2014  Ma
2015/0129880 A1*  5/2015  Wu ..................... G09G 3/344
                                              257/72

FOREIGN PATENT DOCUMENTS

| CN | 102798994 A | 11/2012 |
| CN | 102819995 A | 12/2012 |
| CN | 102998865 A | 3/2013 |
| CN | 103022033 A | 4/2013 |
| CN | 103185999 A | 7/2013 |
| CN | 103474435 A | 12/2013 |
| KR | 1020080076519 A | 8/2008 |

OTHER PUBLICATIONS

Second Chinese Office Action Appln. No. 201310425475.0; dated Nov. 2, 2015.
International Search Report dated Oct. 27, 2014; PCT/CN2014/082558.
Written Opinion of the International Searching Authority dated Oct. 27, 2014; PCT/CN2014/082558.
First Chinese Office Action dated Jun. 9, 2015; Appln. No. 201310425475.0.

* cited by examiner

ARRAY SUBSTRATE AND FABRICATION METHOD THEREOF

TECHNICAL FIELD

Embodiments of the disclosure relate to an array substrate and a fabrication method thereof.

BACKGROUND

An array substrate is provided with structures such as gate lines, data lines, thin film transistors and pixel electrodes, and the above-mentioned structures are made of conductive materials of different layers. Typically, the array substrate is of a layered structure and comprises a gate metal layer forming gate electrodes, a source-drain metal layer forming source electrodes and drain electrodes of the thin film transistors and a pixel electrode layer forming the pixel electrodes. Some array substrates are further provided with a common electrode layer forming a common electrode. A gate line is connected with a gate electrode of a thin film transistor; a data line is connected with a source electrode of the thin film transistor; and the gate line is used for turning on the thin film transistor, and the data line is used for inputting a voltage signal to a pixel electrode through the thin film transistor. A wiring region (or referred to as a sector) is disposed in a non-display region on the edge of the array substrate to implement a connection between signal lines and a drive circuit; each of the signal lines includes a portion distributed in a display region of the array substrate, and a portion distributed in the non-display region of the array substrate; and generally, a plurality of signal lines is provided within the wiring region.

When the signal lines are gathered in the wiring region, there may be different distances of paths traversed by the signal lines. The different paths traversed by the signal lines, in a case where a conductive material and a width of the signal lines are same, may cause a length difference between the signal lines, which can result in a resistance difference between the signal lines. Thereby, the lengths of the signal lines affect the lengths of the paths for electrical signal transmission, thus result in various lengths of conductive paths, differences in resistance and capacitance, and finally different delays generated in the signal transmission process, and then a display defect is caused.

To solve the above-described problems, a current practice is that a signal line within the wiring region forms a conductive path in a manner of a fold line, so as to extend the length thereof, and to form a length similar to that of other signal lines, so as to ensure that the resistance differences between the signal lines is in a predetermined range, and ensure that the respective signal lines have the same delays for transmitting signals. As shown in FIG. 1, a region surrounded by a broken line in the drawing is a wiring region, i.e., a wiring region S-S'; and the wiring region S-S' is provided with a signal line 011 close to an edge of the wiring region S-S', and a signal line 012 located in a centre of the wiring region S-S'. In order that the signal line 011 and the signal line 012 form conductive paths with equal resistance, the signal line 012 is made into a fold line, which result in a larger width of the signal line 012 in the wiring region, instead, and the width of the signal line 012 in FIG. 1 is d. Therefore, the number of the signal lines that the wiring region with the same area can accommodate is reduced, which further results in an increased number of drivers (COF, etc.), and the increased number of drivers can inevitably conducting wire to an increase of drive ICs, and ultimately result in increased costs.

SUMMARY

According to an embodiment of the present disclosure, there is provided an array substrate, comprising a plurality of wiring regions disposed in a non-display region, with a plurality of signal lines provided in the wiring regions, wherein at least part of the signal lines within each of the wiring regions are respectively formed by connecting conducting wires located in different layers in series; and any two of the signal lines within a same wiring region have a resistance difference within a threshold range.

For example, the conducting wires are respectively located in a gate metal layer, a source-drain metal layer, a pixel electrode layer or a common electrode layer.

For example, an insulating layer is disposed between any two layers of the gate metal layer, the source-drain metal layer, the pixel electrode layer and the common electrode layer; and the conducting wires located in different layers are connected in series through via holes provided in the insulating layer.

For example, the conducting wires, in different layers, of a same signal line are located in a same cross section; and the cross section is perpendicular to a plane where the array substrate is located.

For example, an end of each of the signal lines is connected with a data line or a gate line of a display region, and another end of each of the signal lines is connected with a drive circuit.

For example, at least one layer of the layers that form a same signal line, each, includes two or more discontinuous conducting wires, and the two or more discontinuous conducting wires are connected in series by at least another conducting wire in a layer, different from the layer where the two or more discontinuous conducting wires are located, to form the signal line.

For example, each of the layers that form a same signal line only includes one conducting wire, and the conducting wires between different layers are connected in series through the via holes to form the signal line.

According to an embodiment of the present disclosure, there is provided a fabrication method of an array substrate, and the method comprises: forming signal lines located in a non-display region and respectively connected with a gate line or a data line. The signal line each are formed by connecting conducting wires located in different layers in series; the signal lines are located within wiring regions of the non-display region of the array substrate, and any two of the signal lines within a same wiring region have a resistance difference within a threshold range.

For example, the method comprises: forming a gate metal layer including the gate line in a display region, and synchronously forming a plurality of discontinuous first conducting wires of each of the signal lines in the non-display region; forming a gate insulating layer and an active layer on the gate metal layer and the first conducting wires; forming first via holes which pass through the gate insulating layer and the active layer at positions corresponding to endpoints of the first conducting wires; and forming a source-drain metal layer including a source electrode, a drain electrode and the data line on the active layer, and simultaneously forming a second conducting wire at a position corresponding to a discontinuous location between the first conducting wires, and filling a conductive material for forming the source electrode, the drain electrode and the data line within the first via holes to connect the first conducting wires and the second conducting wire in series.

For example, the method comprises: forming a gate metal layer including the gate line in a display region, and synchronously forming a plurality of discontinuous first conducting wires of each of the signal lines in the non-display region; forming a gate insulating layer and an active layer on the gate metal layer and the first conducting wire; forming first via holes which pass through the gate insulating layer and the active layer at positions corresponding to endpoints of the first conducting wires; forming a source-drain metal layer including a source electrode, a drain electrode and the data line on the active layer, and simultaneously forming second conducting wires at least at positions corresponding to part of discontinuous locations between the first conducting wires, and filling a conductive material for forming the source electrode, the drain electrode and the data line within the first via holes; forming a passivation layer on the source-drain metal layer, and simultaneously forming second via holes; and forming a pixel electrode layer including a pixel electrode on the passivation layer, and simultaneously forming third conducting wires at least at the discontinuous locations, not formed with the second conducting wires, between the first conducting wires, and filling a conductive material for forming the pixel electrode within the second via holes. The first conducting wires, the second conducting wires and the third conducting wires are connected in series to form the signal line by means of the conductive material within the first via holes and the conductive material within the second via holes.

For example, the method comprises: forming a gate metal layer including the gate line in a display region, and synchronously forming a first conducting wire of each of the signal lines in the non-display region; forming a gate insulating layer and an active layer on the gate metal layer and the first conducting wire; forming a first via hole passing through the gate insulating layer and the active layer on an endpoint of the first conducting wire; and forming a source-drain metal layer including a source electrode, a drain electrode and the data line on the active layer, and simultaneously forming a second conducting wire, and filling a conductive material for forming the source electrode, the drain electrode and the data line within the first via hole to connect the first conducting wire and the second conducting wire in series.

For example, the method comprises: forming a gate metal layer including the gate line in a display region, and synchronously forming a first conducting wire of each of the signal lines in the non-display region; forming a gate insulating layer and an active layer on the gate metal layer and the first conducting wire; forming a source-drain metal layer including a source electrode, a drain electrode and the data line on the active layer, and simultaneously forming a second conducting wire; forming a passivation layer on the source-drain metal layer; and forming a pixel electrode layer including a pixel electrode on the passivation layer, and simultaneously forming a third conducting wire. The fabrication method further comprises: forming via holes, so that the first conducting wire, the second conducting wire and the third conducting wire are connected in series through the via holes to form the signal line.

For example, forming the via holes includes: forming the first via hole passing through the gate insulating layer and the active layer, and forming the second via hole in the passivation layer, so that the first via hole is configured for connecting the first conducting wire and the second conducting wire; and the second via hole is configured for connecting the second conducting wire and the third conducting wire.

For example, forming the via holes includes: forming the first via hole passing through the gate insulating layer and the active layer, and forming the third via hole passing through the gate insulating layer, the active layer, the source-drain electrode layer and the passivation layer; so that the first via hole is configured for connecting the first conducting wire and the second conducting wire, and the third via hole is configured for connecting the first conducting wire and the third conducting wire.

For example, forming the via holes includes: forming the second via hole in the passivation layer, and forming the third via hole passing through the gate insulating layer, the active layer, the source-drain electrode layer and the passivation layer, so that the second via hole is configured for connecting the second conducting wire and the third conducting wire, and the third via hole is configured for connecting the first conducting wire and the third conducting wire.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 2b is a partial cross-sectional schematic view of FIG. 2a;

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Embodiment One

This embodiment provides an array substrate, which comprises: a plurality of wiring regions disposed in a non-display region, a plurality of signal lines is provided in the wiring regions, at least part of the signal lines within each of the wiring regions are connected in series by conducting wires located in different layers; and any two of the signal lines within each of the wiring regions have a resistance difference within a threshold range.

The array substrate comprises a display region located in a middle position (also often referred to as an AA region) and a non-display region located in a periphery of the display region. Usually, after the array substrate and an opposite substrate are assembled into a display device, the non-display region is covered by a frame of the display device. A plurality of wiring regions are disposed in the non-display region; a plurality of signal lines is disposed in each of the wiring regions; each of the signal lines may be a gate line or a data line; a portion, located within the wiring region, of the signal line is used for connecting with a drive circuit, i.e., an end of the signal line is connected with the gate line or the data line in the display region, and another end of the signal line is connected with the drive circuit.

The array substrate has a layered structure, and comprises a plurality of conductive layers which can conduct electricity; and for example, an insulating layer which has an insulation function is disposed between the conductive layers.

In a current technology, all the composite parts of the signal line are located in a same layer of the array substrate. The signal lines located in the same layer are made of a same material, and usually the signal lines are equal in width; and in order that a resistance difference formed between the signal line in the peripheral position and the signal line in the middle position of the wiring region is within a threshold range, it is necessary to keep a length difference between the signal lines within a certain range. Therefore, the signal line in the middle position of the wiring region is bent, referring to a signal line 012 in FIG. 1 for details.

Figure 1:
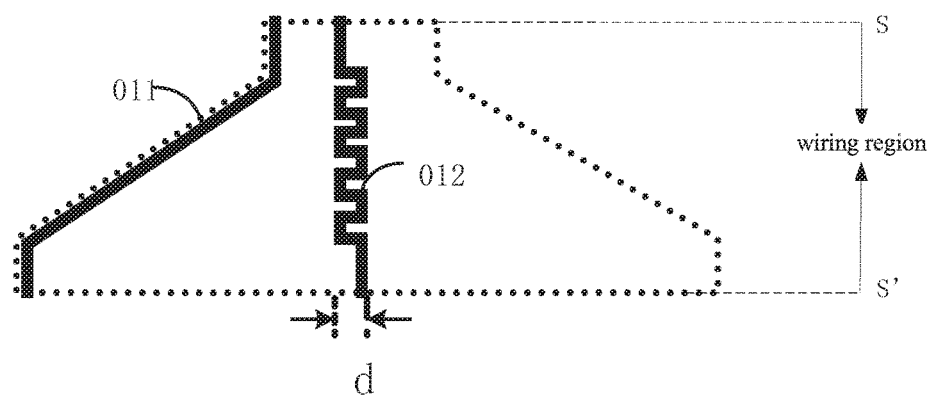
FIG. 1 is a structural schematic view of a wiring region of an array substrate in a current technology.
Figure 2A:
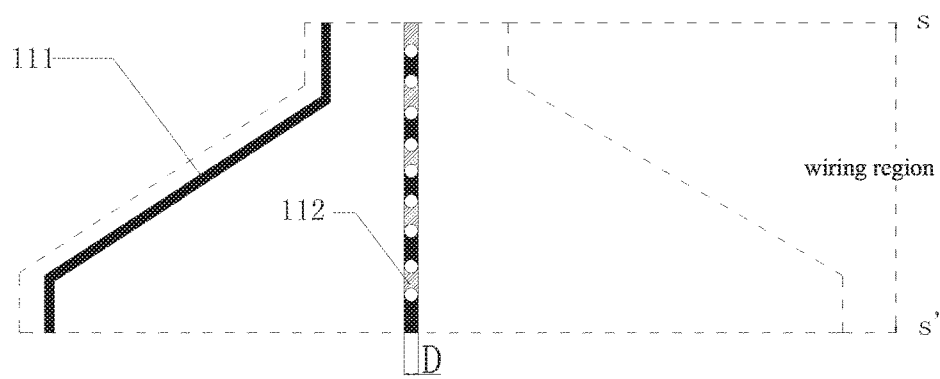
FIG. 2a is a top-view structural schematic view of a wiring region of an array substrate according to Embodiment One of the present disclosure.
Figure 2B:
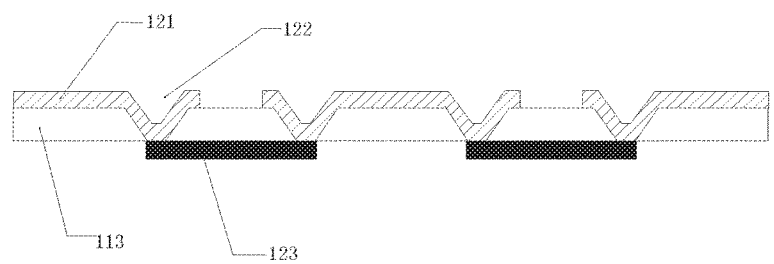

However, in the embodiment of the present disclosure, within the wiring region S-S' shown in FIGS. 2a-2b, there are a signal line 111 formed by conducting wires located in a peripheral position of the wiring region S-S' and located in the same layer of the array substrate, and a signal line 112 formed by connecting the conducting wires, located in the middle position of the wiring region S-S' and located in different layers, in series. For example, the signal line 112 located in the middle position of the wiring region S-S' is formed by connecting a first conducting wire 121 and a second conducting wire 123 in series through a via hole 122. An insulating layer 113 is disposed between the first conducting wire 121 and the second conducting wire 123, and the form of the insulating layer is different, depending on different layers in which the first conducting wire 121 and the second conducting wire 123 are located. Comparing FIG. 1 with FIG. 2a, it can be seen that, a width d of the signal line 012 occupying in the wiring region in FIG. 1 is greater than a width D occupied by the signal line 112 in FIG. 2. The signal line located in the middle position of the wiring region S-S' in FIG. 2a is formed by connecting the conducting wires located in different layers in series, so that the signal line bends within a plane perpendicular to a plat surface where the array substrate is located, which achieves an effect of extending the length of the signal line, and at the same time narrows the width of the signal line within the wiring region. Therefore, the number of signal lines that may be provided within the wiring region is increased, and the number of the wiring regions on the array substrate may be reduced, which reduces the number of drivers, and thus saves costs.

In the embodiment of the present disclosure, any two signal lines within the same wiring region have a resistance difference within a threshold range. The threshold can be a value decided by factors such as a size of the array substrate. For example, the signal line with a maximum resistance and the signal line with a minimum resistance have a resistance ratio limited to a range of 3:1. The number of the conducting wires located in different layers may be increased, so that the number of connection points (i.e., via holes) formed is increased, which extends a signal line path for connecting; or the conducting wires may also be bent in a layer where the conducting wires are not connected with the drive circuits, without affecting the density of the signal lines in the wiring region, so as to extend a transmission path of the conducting wires, so that the resistance difference between any two signal lines is controlled within the threshold range.

In a specific implementation process, for example, all the signal lines are formed by connecting the conducting wires located in two layers in series; in one of the layers, the conducting wires of the signal lines are all equal in number, length and width; and in the other layer, the number of the conducting wires included by the respective signal lines are equal and the widths thereof are also equal, and along the directions in which the signal lines are arranged within the wiring region, the lengths of the conducting wires included by the signal lines become progressively shorter from the middle to both sides of the wiring region. In addition, all the signal lines may be formed by connecting the conducting wires located in a plurality of layers in series; all the signal lines comprise an equal number of conducting wires in a same layer, and transmission paths formed by the conducting wires in the same layer in the wiring region become progressively shorter from the middle to both sides of the wiring region, so as to achieve the finally effect of equal resistance.

In a specific implementation process, when the conducting wires located in different layers are within a same cross section of the array substrate, the conducting wires, in different layers, of the same signal line are located within the same cross section, for example, as shown by the signal line 112 in FIG. 2a-FIG. 2b. For the conducting wires located in different layers, when the conducting wires in one of the layers are bent, the conducting wires, located in different layers, of the same signal line may be located in two or more cross sections perpendicular to the array substrate, as shown in FIG. 3.

According to different types of displays, layered structures of the array substrate and positional relationships between the respective layers are different. For example, an array substrate comprises a gate metal layer, a gate insulating layer, an active layer, a source-drain metal layer, a passivation layer and a pixel electrode layer; the gate metal layer is used for forming a gate line; the gate insulating layer is disposed on the gate metal layer; the active layer includes a semiconductor layer and a doped semiconductor layer; the source-drain metal layer is used for forming a source electrode and a drain electrode of a thin film transistor and a data line; and the passivation layer is used for protecting structures located below it. The pixel electrode layer is used for forming a pixel electrode. The pixel electrode is connected with the drain electrode of the thin film transistor. In the above layers, the gate metal layer, the source-drain metal layer, and the pixel electrode layer all belong to conductive layers; so when the above-described conductive layers form the structures included in the array substrate, the conducting wires for forming the signal line may be formed through a patterning process. Then the conducting wires in different layers are connected through the via holes, so as to form the signal line. In this embodiment, each of the passivation layer, the gate insulating layer and the active layer can be deemed as the insulating layer which is located between the conductive layers and has an insulation function.

At least part of the conducting wires is located in the gate metal layer, the source-drain metal layer, the pixel electrode layer or a common electrode layer. The conducting wire located in the gate metal layer and the conducting wire located in the source-drain metal layer are connected through the via hole passing through the above gate insulating layer and the active layer; the conducting wire located in the source-drain metal layer and the conducting wire located in the pixel electrode layer are connected through the via hole disposed in the passivation layer; and the conducting wire located in the gate metal layer and the conducting wire located in the pixel electrode layer are connected through the via hole passing through intermediate layers such as the gate insulating layer and the passivation layer.

Figure 3:
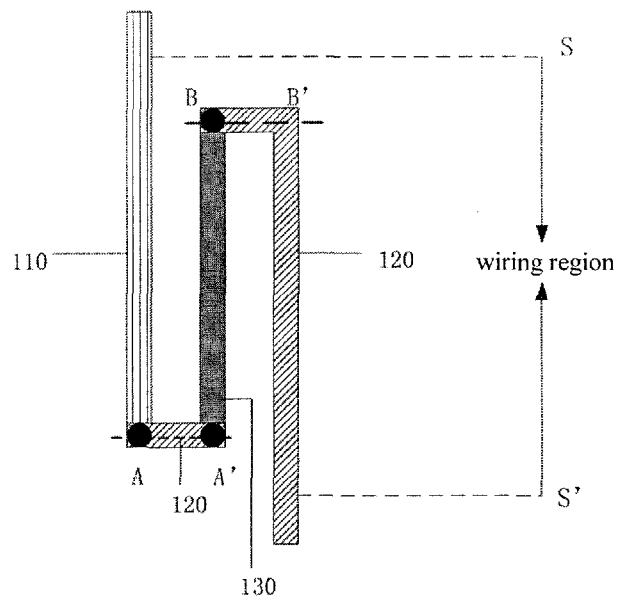
FIG. 3 is a top-view structural schematic view of a signal line of the array substrate according to Embodiment One of the present disclosure.

For example, as shown in FIG. 3, the signal line includes a conducting wire located in a pixel electrode layer 120, a conducting wire located in a source-drain metal layer 130 and a conducting wire located in a gate metal layer 110; the above-described conducting wires are connected in series to form a conductive signal line. Because the signal line is bent in a series connection manner between different layers, the lengths of the conducting wires are increased, and the resistances are increased, so that the resistance difference between the respective signal lines can be adjusted by adjusting the distribution and the number of the conducting wires. Further, by increasing the number of times of bending the signal line between different layers, so as to further increase the resistance of the signal line located in the middle position of the wiring region and reduce the resistance difference between the signal line located in the middle position of the wiring region and the signal line located in the periphery, it is finally achieved that any two signal lines within the wiring region have a resistance difference within a threshold range.

The effect achieved by the above-described structure is that: an area taken by the signal line in the gate metal layer or the source-drain metal layer is reduced, so that the density of the signal lines within the wiring region can be further improved, and the number of the signal lines to which one driver corresponds and connects in one signal line region is increased, and this helps to reduce the number of the drivers (such as COFs), save cost and make full use of the areas of different layers. Further, the array substrate can be finished without any additional patterning process, with an advantage of easy implementation, which in the meantime helps to reduce the area of the non-display region, and to realize a narrow frame.

Further, by changing the distribution and the number of the conducting wires located in different layers, the structure of the signal line includes at least two types as follows.

Type One: at least one of the layers that form the same signal line includes two or more discontinuous conducting wires. For example, a signal line A includes two discontinuous first conducting wires located in the gate metal layer and a second conducting wire which is located in the source-drain metal layer and corresponds to a discontinuous location 001 (as illustrated in FIG. 2b) between the two conducting wires located in the gate metal layer; and the first conducting wires and the second conducting wire are connected through the via holes passing through the gate insulating layer and the active layer. The second conducting wire is used as an intermediate connecting portion between the two first conducting wires.

Type Two: each of the layers that form the same signal line includes only one conducting wire, and the conducting wires between different layers are connected in series through via holes to form the signal line. For example, a signal line B includes a first conducting wire located in the gate metal layer, a second conducting wire located in the source-drain metal layer, and a third conducting wire located in the pixel electrode layer. For example, along a direction of signal transmission, the first conducting wire, the second conducting wire and the third conducting wire can all pass though the entire wiring region in the layer where they are respectively located, so as to form a bent signal line in a space perpendicular to the plane where the array substrate is located.

The above-described two structures can both well achieve the reduction of the resistance difference between the signal lines, and meanwhile reduce the width of a single signal line in the wiring region, so as to improve the density of the signal lines in the wiring region and reduce the number of the drivers.

In order to further reduce the resistance difference between the signal lines, i.e., to reduce the length difference between the signal lines, the conducting wires located in different layers shown in FIG. 3 may be bent; because the signal lines between the layers are bent, and simultaneously the conducting wires in at least one of the layers are bent within a plane parallel to the plane where the array substrate is located, it is ensured that a bending radius d of the signal lines in the wiring region is smaller than the width of the signal lines in the conventional array substrate with the same type and the same size, so as to facilitate the gather of the connecting signal lines and the reduction of the number of the drivers.

Figure 4:
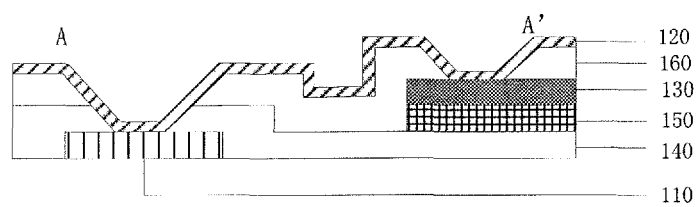
FIG. 4 is a sectional view of FIG. 3 at location A-A'.
Figure 5:
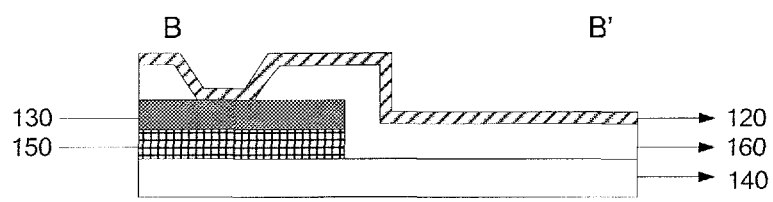
FIG. 5 is a sectional view of FIG. 3 at location B-B'.

FIG. 4 is a sectional view of FIG. 3 at location A-A', in FIG. 4, 160 is a passivation layer, 150 is an active layer, and 140 is a gate insulating layer. With reference to FIG. 4, the conducting wire in the pixel electrode layer 120 is connected with the conducting wire located in the gate metal layer 110 through a via hole, and the conductive material for connecting the two is the conductive material for forming the pixel electrode layer 120. FIG. 5 is a sectional view of FIG. 3 at location B-B'.

Embodiment Two

The array substrate according to this embodiment comprises: a plurality of wiring regions disposed in a non-display region, a plurality of signal lines is provided in the wiring regions, at least part of the signal lines within each of the wiring regions is formed by connecting conducting wires located in different layers in series; and any two signal lines within the same wiring region have a resistance difference within a threshold range. The conducting wires in different layers are sequentially connected along an extending direction of the signal lines.

Figure 6:
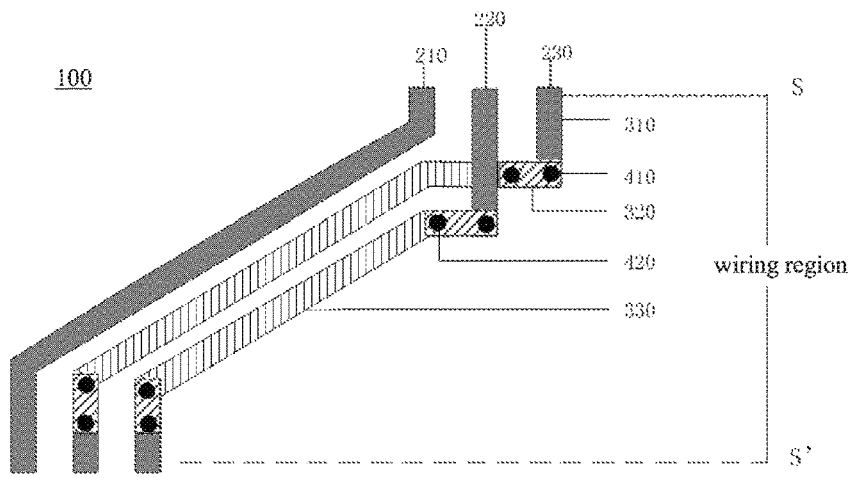
FIG. 6 is a top-view structural schematic view of a signal line of an array substrate according to Embodiment Two of the present disclosure.

As shown in FIG. 6, the array substrate 100 comprises a pixel electrode layer, a gate metal layer, and a source-drain metal layer. The signal lines, shown in FIG. 6, located in the non-display region of the array substrate include: a signal line 210, a signal line 220 and a signal line 230. The signal line 210 is only formed by a conducting wire in a source-drain metal layer 310; the signal line 220 is formed by connecting the conducting wire in the source-drain metal layer 310, a conducting wire in a pixel electrode layer 320, and a conducting wire in a gate metal layer 330, in series; and the signal line 230 is formed by connecting the conducting wire in the source-drain metal layer 310, the conducting wire in the pixel electrode layer 320 and the conducting wire in the gate metal layer 330, in series; 410 is a via hole connecting the conducting wire in the source-drain metal layer 310 and the conducting wire in the pixel electrode layer 320; and 420 is a via hole connecting the conducting wire in the pixel electrode layer 320 and the conducting wire in the gate metal layer 330. In order to achieve that the signal line 220 and the signal line 230 and the signal line 210 have a resistance difference within a threshold range, so as to achieve a small difference in transmission delays between different signal lines, the signal line 220 and the signal line 230 adopt the signal lines as described in the array substrate according to this embodiment and formed by connecting the conducting wires in different layers in series, so as to extend lengths of the signal line 220 and the signal line 230 in a three-dimensional space, and the signal line 230 which is originally located in the center of the wiring region is redistributed to the periphery of the wiring region, so as to help to achieve equal resistance in the wiring region.

In a specific implementation process, the conducting wires located in different layers may have their positions changed according to needs, and the position of the signal line originally located in the middle position of the wiring region and the position of the signal line originally located in the periphery of the wiring region may be exchanged, so as to achieve a further reduction in the resistance difference between the signal lines by exchanging. As shown in FIG. 6, the signal line 230 located in the middle position of the wiring region and the signal line 220 located close to the periphery of the wiring region exchange their positions by arranging the conducting wires in different layers, so as to achieve the extension of the length of the signal line 230, and meanwhile, as the signal line 230 moves to an outside of the wiring region, other signal lines, such as 220, located in the wiring region have a greater space to achieve horizontal bending, so as to facilitate achieving equal resistance in the entire wiring region.

In the specific implementation process, the array substrate further comprises a common electrode layer. For example, for an IPS (In-Plane Switching) liquid crystal panel, both the common electrode and the pixel electrode are located on the array substrate. In addition, on an ADS (Advancedsuper Dimension Switch) fringe field display panel, for example, both the common electrode and the pixel electrode are located on the array substrate, but located in different layers of the array substrate, and an insulating layer is disposed therebetween. The material for forming the common electrode is also a conductive material, so it is possible to form the conducting wires in the common electrode layer including the common electrode only by changing a mask, and then connecting the conducting wires in different layers in series, so as to form the signal line.

In the specific implementation process, a signal line may be formed only by connecting the conducting wires located in two layers in series, or be formed by connecting the conducting wires located in more than two layers in series.

Further, the signal lines include a gate line and a data line; the line whose output terminal is connected with a gate electrode of a thin film transistor in the array substrate is a gate line, and is used for transmitting a gate electrode signal; and the line whose output terminal is connected with a drain electrode of the thin film transistor in the array substrate is a data line, and is used for inputting a corresponding signal to the pixel electrode. The gate line is connected with a gate electrode driver, and used for inputting a gate scanning signal, so as to turn on or turn off the corresponding thin film transistor. The data line is connected with a data line driver, and used for inputting a voltage to the pixel electrode, which voltage is used for providing a deflection voltage of liquid crystal molecules to the pixel electrode when used in a liquid crystal display. Different resistances of the respective signal lines can result in different time delays for the signals that they transmit, and excessively great difference of time delays can result in poor display, so the resistance difference can be adjusted by adjusting the lengths of the signal lines, the conductive material forming the signal lines and various conducting wire connections. The present embodiment further provides that the resistance difference between the signal lines is smaller than a threshold. The threshold can be set according to the need, and in the specific implementation process, a resistance ratio between the signal lines is maintained within a range of 3:1, which causes no adverse or only slight adverse effect for displaying, and meanwhile, requirements on fabrication process are relatively low, so it is easily implemented.

In the specific implementation process, the signal lines may be connected with the drive circuit in any conductive layer of the array substrate, for example, connected with the drive circuit through the conducting wire in the gate metal layer and the conducting wire in the source-drain metal layer.

In the array substrate according to this embodiment, at least part of the signal lines is bent in a three-dimensional space among a plurality of layers of the array substrate, the signal lines, the resistances of which meet the needs, are formed by connecting the conducting wires located in different layers in series, and meanwhile, the problem that the signal lines take an excessively large area can not occur, which avoids the problem that it is not conducive to the formation of the narrow frame of the non-display region.

Embodiment Three

This embodiment provides a fabrication method of an array substrate, and the fabrication method comprises: forming a signal line located in a non-display region and connected with a gate line or a data line. The signal line is formed by connecting conducting wires located in different layers in series; the signal line is located within a wiring region of the non-display region of the array substrate; and any two signal lines within a same wiring region have a resistance difference within a threshold range.

For example, the signal line which is formed by the conducting wires located in different layers at least includes two types of structures as follows.

Type One: at least one layer of the conductive layers that are used for forming the conducting wires in the array substrate is provided with a plurality of conducting wires, and then the plurality of conducting wires is connected in series through a conducting wire located in different layers.

Type Two: in each of the conductive layers, which are used for forming the conducting wires, of the array substrate, corresponding to one signal line, a conducting wire is formed, and then the conducting wires located in different layers are connected in series.

For the structure of Type One, a plurality of specific modes for implementation provided below can be used.

Mode One: when the signal line is formed only by connecting the conducting wires in two layers in series and each of the layers at least includes two conducting wires, the fabrication method specifically comprises the following steps.

Step 1: forming a gate metal layer including the gate line in a display region, and synchronously forming a plurality of discontinuous first conducting wires of the signal line in the non-display region.

Step 2: forming a gate insulating layer and an active layer on the gate metal layer and the first conducting wires.

Step 3: forming first via holes passing through the gate insulating layer and the active layer corresponding to endpoints of the first conducting wire.

Step 4: forming a source-drain metal layer including a source electrode, a drain electrode and the data line on the active layer, and simultaneously forming second conducting wires correspondingly at the discontinuous locations between the first conducting wires; and filling a conductive material for forming the source electrode, the drain electrode and the data line within the first via holes so as to connect the first conducting wires and the second conducting wires in series.

In the array substrate fabricated in this mode, at least part of the signal lines are formed by connecting the conducting wires in the gate metal layer and the conducting wires in the source-drain metal layer in series, and the via holes passing through the gate insulating layer and the active layer is used when they are connected in series.

Figure 7:
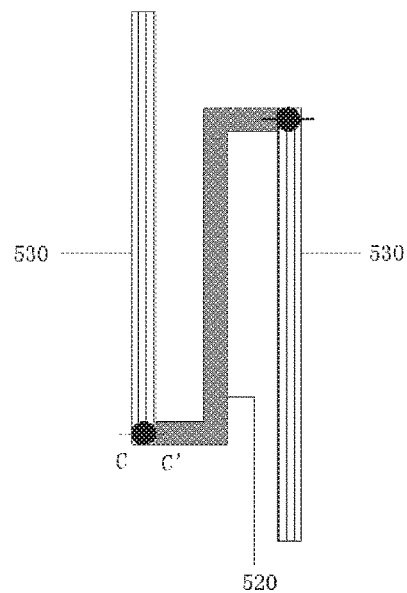
FIG. 7 is top-view structural schematic view I of a signal line fabricated by a fabrication method of an array substrate according to Embodiment Three of the present disclosure.
Figure 8:
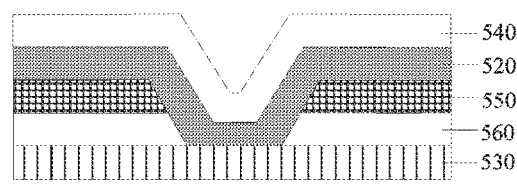
FIG. 8 is a sectional view of FIG. 7 at location C-C'.

As shown in FIG. 7, the signal line includes first conducting wires located in a gate metal layer 530 and a second conducting wire located in a source-drain metal layer 520. The first conducting wires and the second conducting wire are connected through the via holes. FIG. 8 is a sectional view of FIG. 7 at location C-C'. From FIG. 8, it can be seen that the array substrate according to this embodiment comprises a gate metal layer 530, a gate insulating layer 560, an active layer 550, a source-drain metal layer 520 and a passivation layer 540. In FIG. 7, when the gate metal layer 530 is connected with the source-drain metal layer 520, a step of forming the via holes is added, a connection in this mode can effectively ensure the reliability of the connection, and can reduce the contact resistances of connection points.

In a specific implementation process, the conducting wires forming the signal lines may also be located in other layers, such as a pixel electrode layer and a common electrode layer. The first conducting wire is formed together with the gate line, which only needs to change a mask without any additional step, so it is easily implemented. The same principle of formation is also applicable to the formation of the second conducting wire, and the connection between the first conducting wire and the second conducting wire is implemented synchronously when the second conducting wire is formed, so it is easily implemented. The signal lines formed are not limited to the same layer of the array substrate, but are formed in a plurality of layers; by changing the original signal lines which bend in a plane to the signal lines which bend in the space according to the embodiment of the present disclosure, the area of a single signal line taken in one layer of the array substrate can be reduced, so as to help to improve the density of the signal lines within the wiring region, so that in a case that the area of the wiring region remains unchanged, the number of the signal lines that can be connected with one drive circuit increases, which thus reduces the number of the drivers and helps to reduce costs.

Mode Two: the signal line is formed by connecting the conducting wires in three layers in series in the array substrate; and each of the layers includes at least two conducting wires forming the same signal line. The fabrication method specifically comprises the following steps.

Step 1: forming a gate metal layer including the gate line in a display region, and synchronously forming a plurality of discontinuous first conducting wires of the signal line in the non-display region.

Step 2: forming a gate insulating layer and an active layer on the gate metal layer and the first conducting wire.

Step 3: forming first via holes which pass through the gate insulating layer and the active layer and correspond to endpoints of the first conducting wires.

Step 4: forming the source-drain metal layer including a source electrode, a drain electrode and a data line on the active layer, and simultaneously forming second conducting wires at least at positions corresponding to part of the discontinuous locations between the first conducting wires, and filling a conductive material for forming the source electrode, the drain electrode and the data line within the first via holes.

Step 5: forming a passivation layer on the source-drain metal layer, and simultaneously forming second via holes.

Step 6: forming a pixel electrode layer including a pixel electrode on the passivation layer, and simultaneously forming third conducting wires at least at the discontinuous locations, where the second conducting wires are not formed, between the first conducting wires, and filling a conductive material for forming the pixel electrode within the second via holes.

The first conducting wires, the second conducting wires and the third conducting wires are connected in series to form the signal line through the conductive material within the first via holes and the conductive material within the second via holes.

By the above-described method of implementation, it is achieved that the signal line is formed by the conducting wires located in three layers in the array substrate, and the formed signal line may be as shown in FIG. 4 or FIG. 5.

In FIG. 4 or FIG. 5, the mode of using indium tin oxide (ITO) to realize the connection can be easily implemented in the conventional process flow, with simple process and high reliability.

Mode Three: the fabrication method is used for forming the array substrate, which comprises a signal line formed by connecting the conducting wires in four layers in series; and among the conductive layers provided with the conducting wires, each layer includes at least two conducting wires forming the same signal line. In the specific implementation process, some fabrication methods of the array substrate further comprises a step of forming a common electrode, such as the array substrate of ADS—fringe field mode. The ADS array substrate includes a pixel electrode and a common electrode; and the pixel electrode and the common electrode are located in different layers, which are usually made of ITO.

Figure 9:
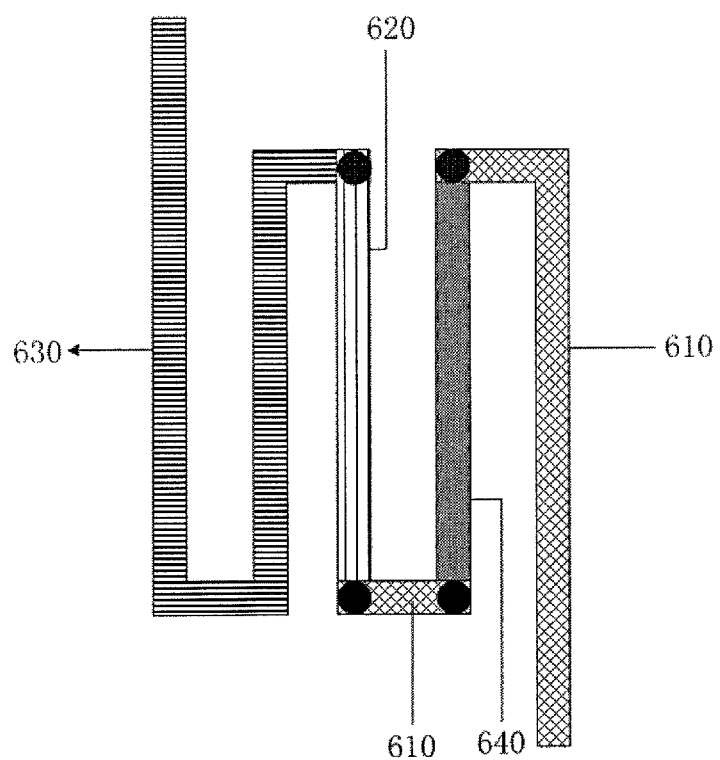
FIG. 9 is top-view structural schematic view II of a signal line fabricated by the fabrication method of the array substrate according to Embodiment Three of the present disclosure.

A shown in FIG. 9, the fabrication method specifically comprises:

Forming a gate metal layer 620 including a gate electrode, and simultaneously forming conducting wires for forming the signal line;

Forming a first ITO layer 610 including a transparent electrode for forming a fringing field through a first ITO patterning process, and synchronously forming conducting wires located in the first ITO layer 610. The first ITO patterning process is used for forming the pixel electrode or the common electrode. If the first ITO patterning process is used for forming the pixel electrode, the second ITO patterning process is used for forming the common electrode. If the first ITO patterning process is used for forming the common electrode, the second ITO patterning process is used for forming the pixel electrode.

Forming a source-drain metal layer 640, and synchronously forming conducting wires located in the source-drain metal layer 640;

Forming a second ITO layer 630 including a transparent electrode for forming the fringing field through a second ITO patterning process, and synchronously forming conducting wires located in the second ITO layer 630 through the patterning process;

If an insulating layer is disposed between two conductive layers made of conductive materials, then via holes for connecting the two conducting wires in the two conductive layers is formed synchronously when the insulating layer is formed, and the connection between the conducting wires is implemented by the conductive material within the via hole.

In the above-described mode of implementation, the signal line in the substrate is formed by connecting the conducting wires located in four different layers.

In the above-described modes of implementation, the patterning process includes one or more fabrication processes of depositing, coating, exposing, developing, etching and the like.

For the structure of Type Two, a plurality of specific modes for implementation provided below can be used.

Mode One: this mode is used for forming the array substrate comprising the signal line formed by connecting the conducting wires in two layers in series; and each of the layers for forming the same signal line only includes one conducting wire.

Step 1: forming a gate metal layer including a gate line in the display region, and synchronously forming a first conducting wire of the signal line in the non-display region.

Step 2: forming a gate insulating layer and an active layer on the gate metal layer and the first conducting wire.

Step 3: forming a first via hole passing through the gate insulating layer and the active layer on an endpoint of the first conducting wire;

Step 4: forming a source-drain metal layer including a source electrode, a drain electrode and the data line on the active layer, and simultaneously forming a second conducting wire, and filling a conductive material for forming the source electrode, the drain electrode and the data line within the first via hole to connect the first conducting wire and the second conducting wire in series.

In a specific implementation process, the conductive layer where the first conducting wire or the second conducting wire is located may also be changed.

Mode Two: part of the signal lines in the array substrate fabricated in this mode are formed by connecting the conducting wires in three layers in series; and each of the layers for forming the same signal line only includes one conducting wire. The fabrication method typically comprises the following steps.

Step 1: forming a gate metal layer including a gate line in the display region, and synchronously forming a first conducting wire of the signal line in the non-display region.

Step 2: forming a gate insulating layer and an active layer on the gate metal layer and the first conducting wire.

Step 3: forming a source-drain metal layer including a source electrode, a drain electrode and a data line on the active layer, and simultaneously forming a second conducting wire.

Step 4: forming a passivation layer on the source-drain metal layer.

Step 5: forming a pixel electrode layer including a pixel electrode on the passivation layer, and simultaneously forming a third conducting wire.

The fabrication method of the array substrate further comprises a step of forming via holes, and the step includes the following steps.

Step A: forming a first via hole passing through the gate insulating layer and the active layer. In a specific implementation process, the step A is arranged between the step 2 and the step 3.

Step B: forming a second via hole in the passivation layer. The step B is arranged between the step 4 and the step 5.

In the above step A and step B, the first via hole is used for connecting the first conducting wire and the second conducting wire; and the second via hole is used for connecting the second conducting wire and the third conducting wire.

In the method for implementing the array substrate according to this embodiment, the first conducting wire of the array substrate is only connected with the second conducting wire; the third conducting wire is only connected with the second conducting wire; and the second conducting wire is used as a bridge portion for connecting the first conducting wire and the third conducting wire to form the signal line.

Mode Three: part of the signal lines in the array substrate fabricated in this mode are formed by connecting the conducting wires in three layers in series; and each of the layers for forming the same signal line only includes one conducting wire. The fabrication method typically comprises the following steps.

Step 1: forming a gate metal layer including a gate line in the display region, and synchronously forming a first conducting wire of the signal line in the non-display region.

Step 2: forming a gate insulating layer and an active layer on the gate metal layer and the first conducting wire.

Step 3: forming a source-drain metal layer including a source electrode, a drain electrode and a data line on the active layer, and simultaneously forming a second conducting wire.

Step 4: forming a passivation layer on the source-drain metal layer.

Step 5: forming a pixel electrode layer including a pixel electrode on the passivation layer, and simultaneously forming a third conducting wire.

The fabrication method further comprises a step for forming via holes, and the step typically includes the following steps.

Step A: forming a first via hole passing through the gate insulating layer and the active layer. The step A is arranged between the step 2 and the step 3.

Step B: forming a third via hole passing through the gate insulating layer, the active layer and the passivation layer. The step B is arranged between the step 4 and the step 5.

In the step A and the step B, the first via hole is used for connecting the first conducting wire and the second conducting wire; and the third via hole is used for connecting the first conducting wire and the third conducting wire.

In the method for implementing the array substrate according to this embodiment, the first conducting wire of the array substrate is only connected with the second conducting wire; the third conducting wire is only connected with the first conducting wire; and the first conducting wire is used as a bridge portion for connecting the third conducting wire and the second conducting wire to form the signal line.

Mode Four: part of the signal lines in the array substrate fabricated in this mode are formed by connecting the conducting wires in three layers in series; and each of the layers which are used for forming the same signal line only includes one conducting wire. The fabrication method typically comprises the following steps.

Step 1: forming a gate metal layer including a gate line in the display region, and synchronously forming a first conducting wire of the signal line in the non-display region.

Step 2: forming a gate insulating layer and an active layer on the gate metal layer and the first conducting wire.

Step 3: forming a source-drain metal layer including a source electrode, a drain electrode and a data line on the active layer, and simultaneously forming a second conducting wire.

Step 4: forming a passivation layer on the source-drain metal layer.

Step 5: forming a pixel electrode layer including a pixel electrode on the passivation layer, and simultaneously forming a third conducting wire.

The fabrication method further comprises a step of forming via holes, and the step of forming the via holes typically includes the following steps.

Step A: forming a second via hole in the passivation layer.

Step B: forming a third via hole passing through the gate insulating layer, the active layer and the passivation layer.

In the step A and the step B, the second via hole is used for connecting the second conducting wire and the third conducting wire; and the third via hole is used for connecting the first conducting wire and the third conducting wire.

In the step of forming the via holes according to this embodiment, the first via hole and the second via hole may be formed through a same patterning process. The step of forming the via holes is arranged between the step 4 and the step 5.

In the method for implementing the array substrate according to this embodiment, the first conducting wire of the array substrate is only connected with the third conducting wire; the second conducting wire is only connected with the third conducting wire; and the third conducting wire is used as a bridge portion for connecting the first conducting wire and the second conducting wire to form the signal line.

In the fabrication method of the array substrate according to this embodiment, the array substrates fabricated can all be deemed as the array substrates described in the present disclosure.

The fabrication method of the array substrate according to this embodiment is used for fabricating the array substrate of the present disclosure, by which little change is made to the fabrication process, and it is only necessary to change the structure of the mask to complete the fabrication of the conducting wires and the connection between the conducting wires, and thus the method has the advantage of easy implementation; in addition, the array substrate fabricated by using the fabrication method of the array substrate according to the present disclosure has advantages of small bending radius of the signal line, greater density of the signal lines, and conduciveness in reducing the number of drivers, so as to save consumables and manufacturing costs.

What are described above is related to the illustrative embodiments of the disclosure only and not limitative to the scope of the disclosure; the scopes of the disclosure are defined by the accompanying claims.

CROSS-REFERENCE TO RELATED APPLICATIONS

The present application claims the benefit of Chinese Patent Application No. 201310425475.0, filed on Sep. 17, 2013, which is hereby entirely incorporated by reference as part of the present application.

What is claimed is:

1. A fabrication method of an array substrate, comprising: forming signal lines which are located in a non-display region, wherein the signal lines are respectively connected with a gate line or a data line, and the signal lines are respectively formed by connecting conducting wires located in different layers in series; and the signal lines are located within wiring regions in the non-display region of the array substrate, and any two of the signal lines within a same wiring region have a resistance difference within a threshold range; and the signal lines within the same wiring region comprise a first signal line and a second signal line, the first signal line and the second signal line are overlapped with each other in a plan view of the array substrate;

the fabrication method comprising:

synchronously forming a gate metal layer comprising the gate line in a display region, and a plurality of discontinuous first conducting wires of each of the signal lines in the non-display region;

forming a gate insulating layer and an active layer on the gate metal layer and the first conducting wires;

forming first via holes passing through the gate insulating layer and the active layer at positions corresponding to endpoints of the first conducting wires; and simultaneously forming a source-drain metal layer comprising a source electrode, a drain electrode and the data line on the active layer, and a second conducting wire at a position corresponding to a discontinuous location between the first conducting wires, and filling a portion of the second conducting wire within the first via holes to connect the first conducting wires and the second conducting wire in series.

2. A fabrication method of an array substrate, comprising: forming signal lines which are located in a non-display region, wherein the signal lines are respectively connected with a gate line or a data line, and the signal lines are respectively formed by connecting conducting wires located in different layers in series; and the signal lines are located within wiring regions in the non-display region of the array substrate, and any two of the signal lines within a same wiring region have a resistance difference within a threshold range; and the signal lines within the same wiring region comprise a first signal line and a second signal line, the first signal line crosses the second signal line in a plan view of the array substrate, and the first signal line is intersected with the second signal line at a non-zero angle;

synchronously forming a gate metal layer comprising the gate line in a display region, and a plurality of discontinuous first conducting wires of each of the signal lines in the non-display region;

forming a gate insulating layer and an active layer on the gate metal layer and the first conducting wires;

forming first via holes passing through the gate insulating layer and the active layer at positions corresponding to endpoints of the first conducting wires; and simultaneously forming a source-drain metal layer comprising a source electrode, a drain electrode and the data line on the active layer, and a second conducting wire at a position corresponding to a discontinuous location between the first conducting wires, and filling a portion of the second conducting wire within the first via holes to connect the first conducting wires and the second conducting wire in series.

* * * * *